(12) United States Patent  
Song et al.

(10) Patent No.: US 8,276,046 B2  
(45) Date of Patent: Sep. 25, 2012

(54) APPARATUS FOR DETERMINING NUMBER OF BITS TO BE STORED IN MEMORY CELL

(75) Inventors: Seung-Hwan Song, Incheon (KR); Kyoung Lae Cho, Yongin-si (KR); Jun Jin Kong, Yongin-si (KR); Jae Hong Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1103 days.

(21) Appl. No.: 12/219,103

(22) Filed: Jul. 16, 2008

(65) Prior Publication Data

US 2009/0222701 A1  Sep. 3, 2009

(30) Foreign Application Priority Data

Feb. 29, 2008 (KR) .................. 10-2008-0019381

(51) Int. Cl.  
*H03M 13/00* (2006.01)
(52) U.S. Cl. ..................................... 714/774
(58) Field of Classification Search .................. 714/774  
See application file for complete search history.

(56) References Cited

U.S. PATENT DOCUMENTS

| | | | |
|---|---|---|---|
| 7,158,421 B2 | 1/2007 | Li et al. | |
| 7,266,020 B1 | 9/2007 | Trimberger | |
| 7,286,416 B2 | 10/2007 | Ooishi et al. | |
| 7,428,669 B2 * | 9/2008 | Cioffi | 714/704 |
| 2003/0012372 A1 * | 1/2003 | Cheng | 380/28 |
| 2004/0153949 A1 * | 8/2004 | Ro et al. | 714/774 |
| 2004/0223611 A1 * | 11/2004 | Yan et al. | 380/37 |
| 2005/0086574 A1 * | 4/2005 | Fackenthal | 714/766 |
| 2005/0138524 A1 * | 6/2005 | Cioffi | 714/758 |
| 2005/0276259 A1 * | 12/2005 | Nakabayashi et al. | 370/349 |
| 2006/0098484 A1 * | 5/2006 | Roohparvar | 365/185.09 |
| 2007/0011586 A1 * | 1/2007 | Belogolovyi et al. | 714/774 |
| 2007/0171714 A1 * | 7/2007 | Wu et al. | 365/185.09 |
| 2008/0148126 A1 * | 6/2008 | Eilert et al. | 714/755 |
| 2008/0313493 A1 * | 12/2008 | Roohparvar et al. | 714/6 |

OTHER PUBLICATIONS

PCT International Search Report dated Mar. 20, 2009.

* cited by examiner

*Primary Examiner* — Joshua Lohn  
(74) *Attorney, Agent, or Firm* — Harness, Dickey & Pierce, P.L.C.

(57) ABSTRACT

Example embodiments relate to an apparatus which may determine a length of data to be stored in a memory cell, and may store the data in a memory based on the determined length. A memory data storage apparatus according to example embodiments may, include: a determination unit that may determine a number of bits of data and a number of bits of data detection information to be stored in a memory cell; a data receiving unit that may receive data corresponding to the determined number of bits; an error correction coding unit that may perform an error correction coding with respect to the received data and generate data detection information corresponding to the number of bits of the data detection information; and a data storage unit that may store the received data and generated data detection information in the memory cell.

17 Claims, 7 Drawing Sheets

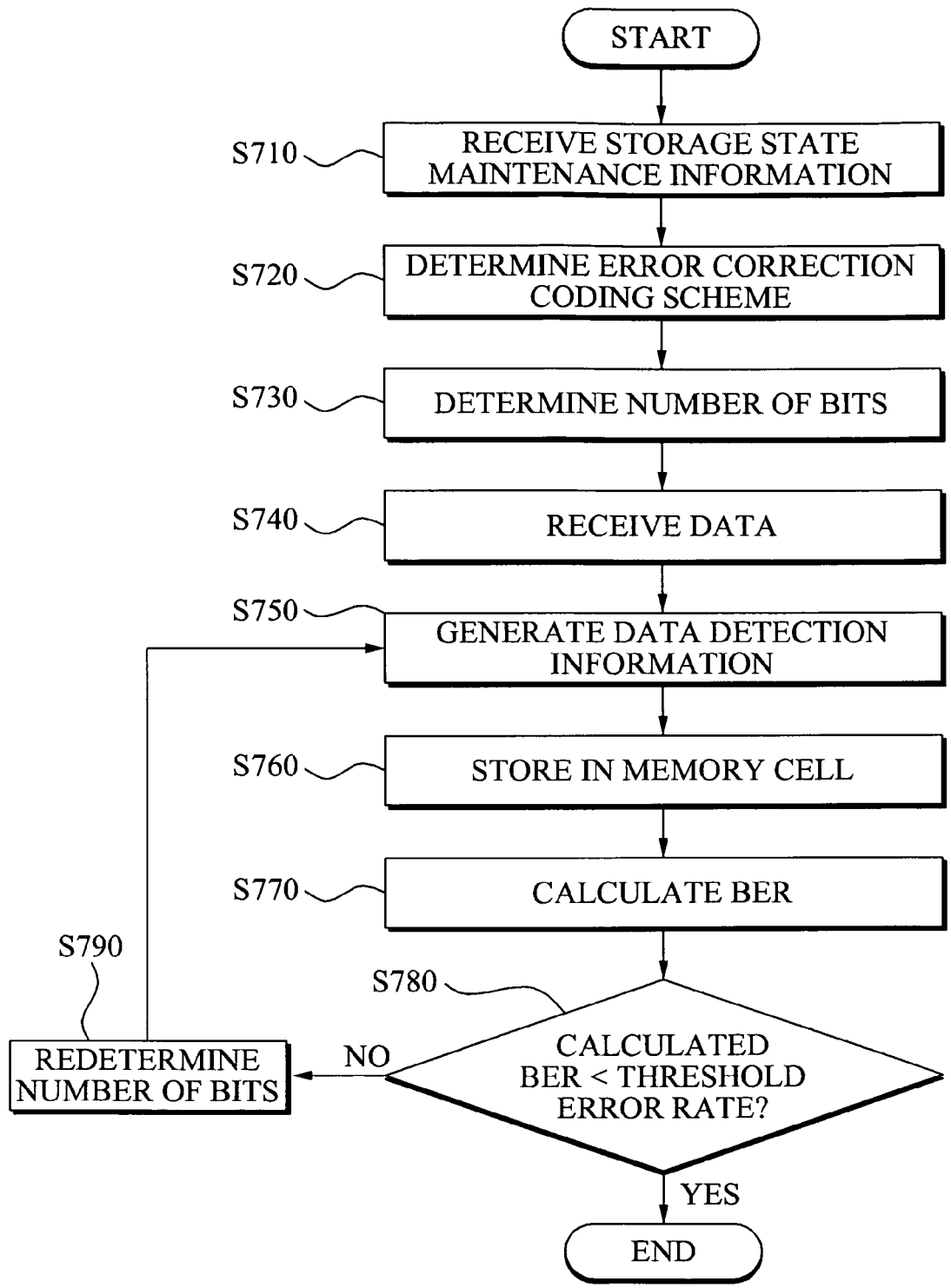

APPARATUS FOR DETERMINING NUMBER OF BITS TO BE STORED IN MEMORY CELL

PRIORITY STATEMENT

This application claims priority under 35 U.S.C. §119 to from Korean Patent Application No. 10-2008-0019381, filed on Feb. 29, 2008, in the Korean Intellectual Property Office (KIPO), the entire contents of which is incorporated herein by reference.

BACKGROUND

1. Field

Example embodiments relate to a memory apparatus storing data. Also, example embodiments relate to an apparatus which may determine a length of data to be stored in a memory cell, and store the data in a memory cell based on the determined length.

2. Description of Related Art

A single-level cell (SLC) memory device may store one bit of data in a single memory cell. The SLC memory may be referred to as a single-bit cell (SBC) memory. The SLC memory may store and read data of one bit at a voltage level included in two distributions that may be divided by a threshold voltage level programmed in a memory cell. Due to a fine electrical characteristic difference between SLC memories, the programmed threshold voltage level may have the distribution within a predetermined range. For example, when a voltage level read from the memory cell is greater than 0.5V and less than 1.5V, it may be determined that the data stored in the memory cell has a logic value of "1". When the voltage level read from the memory cell is greater than 2.5V and less than 3.5V, it may be determined that the data stored in the memory cell has a logic value of "0". The data stored in the memory cell may be classified depending on the difference between cell currents and/or cell voltages during the reading operations.

Meanwhile, a multi-level cell (MLC) memory device that may store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To store 'N' bits in a single memory cell, $2^N$ distributions may be required. But, since the voltage window for a memory cell may be limited, the difference in threshold voltage between adjacent bits may decrease as 'N' increases. Accordingly, read-failure rate may increase. For this reason, in a conventional art, it may be difficult to improve storage density using a MLC memory device.

SUMMARY

Example embodiments may provide a memory data storage apparatus and method that determines a number of bits of data detection information to be stored in a memory cell storing memory data based on a threshold error rate of data to be stored in a memory cell.

Example embodiments also may provide a memory data storage apparatus and method that compares a bit error rate (BER) of data stored in a memory cell with a threshold error rate of data stored in the memory cell, and redetermines a number of bits of data detection information based on a result of the comparing.

According to example embodiments, a memory data storage apparatus may include: a determination unit that determines a number of bits of data to be stored in a memory cell and a number of bits of data detection information; a data receiving unit that receives data corresponding to the determined number of bits; an error correction coding unit that performs an error correction coding with respect to the received data and generates data detection information corresponding to the number of bits of the data detection information; and a data storage unit that stores the received data and generated data detection information in the memory cell.

According to example embodiments, a memory data detection apparatus may include: a data storage unit that stores data and data detection information; a length information storage unit that stores a number of bits of each of the data and data detection information; an error correction decoding unit that calculates a BER of the stored data based on the data detection information; a control unit that compares the calculated BER and a predetermined threshold error rate; and a determination unit that redetermines the number of bits of the data or the number of bits of the data detection information based on a result of the comparing, wherein the data storage unit re-stores the data based on the redetermined number of bits of the data or re-stores the data detection information based on the redetermined number of bits of the data detection information.

According to example embodiments, a memory data storage method may include: determining a number of bits of data to be stored in a memory cell and a number of bits of data detection information; receiving data corresponding to the determined number of bits; performing an error correction coding with respect to the received data and generating data detection information; and storing the received data and generated data detection information in the memory cell.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 7 is a flowchart illustrating a method of determining a number of bits of data to be stored in a memory cell according to example embodiments.

DETAILED DESCRIPTION OF EXAMPLE EMBODIMENTS

Figure 1:
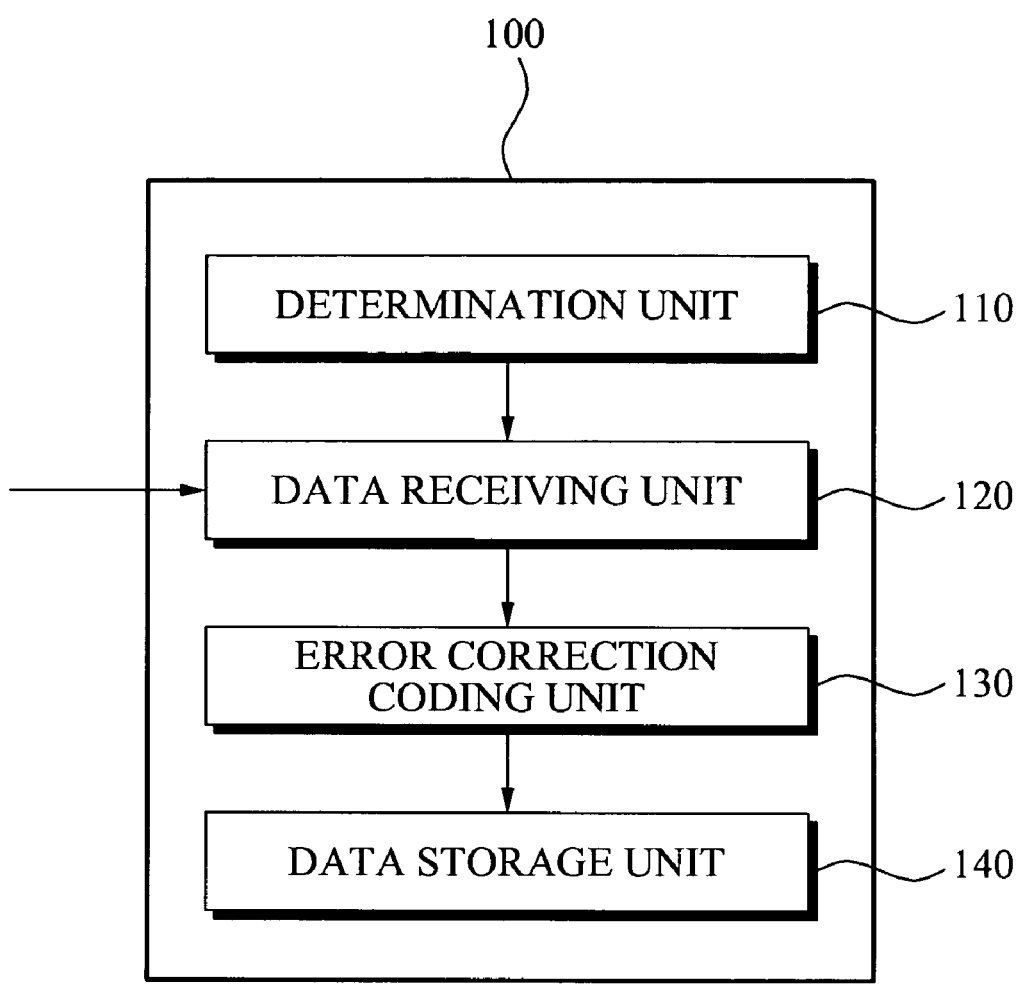
FIG. 1 is a block diagram illustrating a configuration of a memory data storage apparatus which may determine a number of bits of data to be stored in a memory cell and a number of bits of data detection information according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a block diagram illustrating a configuration of a memory data storage apparatus 100, according to example embodiments, which may determine a number of bits of data to be stored in a memory cell and a number of bits of data detection information to be generated. Hereinafter, an operation of the memory data storage apparatus 100 is described in detail with reference to FIG. 1. The memory data storage apparatus 100 may include a determination unit 110, data receiving unit 120, error correction coding unit 130, and data storage unit 140.

The determination unit 110 may determine the number of bits of the data to be stored in the memory cell and the number of bits of the data detection information to be generated.

According to example embodiments, when the memory data storage apparatus 100 stores information of a plurality of bits in the memory cell, a portion of the plurality of bits may be data to be stored in the memory cell, and a portion of the plurality of bits may be data detection information associated with the data to be stored. The memory data storage apparatus 100 may detect data stored in the memory cell using the data detection information.

According to example embodiments, the data detection information may be error correction information about the data to be stored in the memory cell or storage state maintenance information to maintain the data stored in the memory cell.

According to example embodiments, the memory data storage apparatus 100 may determine whether an error is generated in the data stored in the memory cell using the error correction information. Also, when the error is generated in the data stored in the memory cell, the memory data storage apparatus 100 may correct the error.

According to example embodiments, the memory data storage apparatus 100 may maintain and manage the data stored in the memory cell by referring to the storage state maintenance information. The storage state maintenance information may include temperature information of the memory cell storing the data, and threshold error rate information associated with the data stored in the memory cell.

A bit error rate (BER) of the data stored in the memory cell may change depending on an operation temperature of the memory cell. According to example embodiments, the memory data storage apparatus 100 may store the operation temperature when the data is stored in the memory cell as data management information in the memory cell. The data management information may be associated with the data. The memory data storage apparatus 100 may compare the operation temperature when the data is stored with an operation temperature of the memory cell when the data is read. The memory data storage apparatus 100 may redetermine the number of bits of the data stored in the memory cell based on a result of the comparing.

The data receiving unit 120 may receive data corresponding to the number of bits determined by the determination unit 110. According to example embodiments, the data receiving unit 120 may receive the data from a data division unit. The data division unit may divide the data to be stored in the memory cell by a length corresponding to the number of bits determined by the determination unit 110. The data division unit may transmit the divided data to the data receiving unit 120.

The error correction coding unit 130 may perform an error correction coding with respect to the received data and may generate data detection information corresponding to the number of bits of the data detection information determined by the determination unit 110. According to example embodiments, the error correction coding unit 130 may generate the error correction information about the data to be stored in the memory cell according to a Convolutional coding scheme, Bose-Chaudhuri-Hocquenghem (BCH) coding scheme, Trellis coded modulation (TCM) coding scheme, Block coded modulation (BCM) coding scheme, Reed-Solomon coding scheme, or turbo coding scheme.

The data storage unit 140 may store the received data and generated data detection information in the memory cell. According to example embodiments, the data receiving unit 120 may receive the storage state maintenance information about the memory cell together with the data. The data storage unit 140 may store the data detection information including the storage state maintenance information in the memory cell.

According to example embodiments, the data receiving unit 120 may receive a threshold error rate of the data to be stored. The determination unit 110 may determine the number of bits of the data or the number of bits of the data detection information, or both, based on the received threshold error rate.

In general, when an amount of error correction information increases, a stronger error correction may be performed. When a strong error correction scheme is performed, a BER after correcting an error may have a small value even when a BER before correcting the error has a great value. Accordingly, the determination unit 110 may determine the number of bits of the data detection information to enable the BER of the data stored in the memory cell to be less than the received threshold error rate.

Information to be stored in the memory cell may include data and data detection information. Since a number of bits of the information to be stored in the memory cell may be fixed, a number of bits available to be used for the data detection information may be limited. Accordingly, the memory data storage apparatus 100 may determine the number of bits of the data to be stored in the memory cell and the number of bits of the data detection information within a range of a total number of bits of information which may be stored in the memory cell.

The information which may be stored in the memory cell may include the data to be stored in the memory cell and data detection information. Because the number of bits available to be used for data detection information may be limited, an error correcting capability using the data detection information may be limited. An error correction coding scheme may change to improve the error correcting capability with respect to the data stored in the memory cell based on the number of bits available for use as data detection information. According to example embodiments, the determination unit 110 may determine the error correction coding scheme with respect to the received data. The error correction coding unit 130 may generate the data detection information according to the determined error correction coding scheme.

According to example embodiments, a BER calculation unit may calculate a BER of the data stored in the memory cell. According to example embodiments, the BER calculation unit may determine whether the error is generated in the data stored in the memory cell using the error correction information included in the data detection information.

A control unit may compare a predetermined threshold error rate with the BER calculated by the BER calculation unit. According to example embodiments, the threshold error rate may be included in the data detection information. According to example embodiments, the data receiving unit 120 may receive the threshold error rate.

The determination unit 110 may redetermine the number of bits of the data or the number of bits of the data detection information based on a result of the comparing. According to example embodiments, the determination unit 110 may redetermine the number of bits of the data or the number of bits of the data detection information when the BER of the data stored in the memory cell is greater than the threshold error rate. The data storage unit 140 may re-store the data stored in the memory cell based on the redetermined number of bits of the data or re-store the data detection information based on the redetermined number of bits of the data detection information.

When the BER of the data stored in the memory cell is greater than the threshold error rate, the determination unit 110 may determine a number of bits of new data detection information to be greater than the number of bits of the previous data detection information. The error correction coding unit 130 may regenerate the data detection information so that the data detection information corresponds to the redetermined number of bits of the data detection information. Since an amount of the regenerated data detection information may be greater than an amount of the previous data detection information, the error correction coding unit 130 may use an error correction coding scheme stronger than the previous error correction coding scheme. According to example embodiments, the determination unit 110 may determine the error correction coding scheme used by the error correction coding unit 130.

Figure 2:
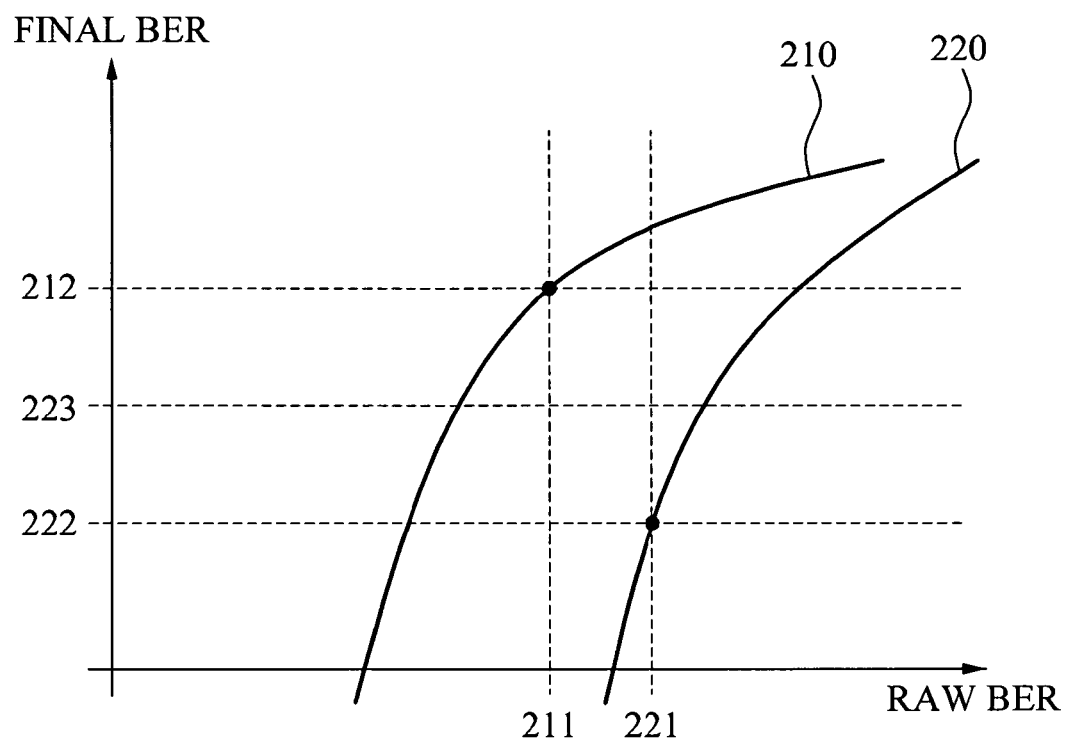
FIG. 2 is a conceptual diagram illustrating a process of determining a number of bits of data to be stored in a memory cell and a number of bits of data detection information in order to enable a bit error rate (BER) less than a predetermined threshold error rate to be calculated according to example embodiments.

FIG. 2 is a conceptual diagram illustrating a method of determining a number of bits of data and a number of bits of data detection information to be stored in a memory cell in order to enable a BER less than a predetermined threshold error rate to be calculated according to example embodiments. Hereinafter, determining the number of bits of the data to be stored in the memory cell is described in detail with reference to FIG. 2.

In FIG. 2, a horizontal axis indicates a raw BER, that is, a BER before correcting an error of the data to be stored in the memory cell. A vertical axis indicates a final BER, that is, a BER after correcting the error by performing an error correction decoding with respect to the data to be stored in the memory cell.

An amount of information which may be stored in the memory cell is related to a number of possible states of the memory cell. According to example embodiments, a determination unit 110 may determine a number of bits of the data or a number of bits of data detection information based on the number of possible states of the memory cell. For example, when the memory cell may have 16 states, the memory cell may store four-bit information at a maximum.

According to example embodiments, a memory data storage apparatus 100 may determine the data detection information considering the number of possible states of the memory cell. For example, when a maximum number of possible states of the memory cell is 16, the memory cell may store four-bit information at a maximum. The four-bit information may include the data to be stored in the memory cell and data management information.

According to example embodiments, the memory data storage apparatus 100 may determine the memory cell which may store the four-bit information to store only three-bit information. The three-bit information may include two-bit data and one-bit data management information. When the memory cell which may store the four-bit information stores only three-bit information, a BER of each bit may decrease.

According to example embodiments, the memory data storage apparatus 100 may determine the memory cell to store two-bit data and two-bit data management information. Accordingly, since the memory cell may store four-bit information, a BER of each bit may increase. However, since an amount of data management information increases, a stronger error correction coding scheme and error correction decoding scheme may be performed. Accordingly, a BER after performing the error correction decoding scheme may decrease in comparison to a BER when storing the three-bit information.

A curve 210 indicates an error correcting capability of an error correction coding unit when storing N-bit data detection information. FIG. 2 illustrates a BER before correcting the error, raw BER 211, and a BER after correcting the error, final BER 212.

A curve 220 indicates an error correcting capability of the error correcting coding unit when N+k bit data detection information is stored. Referring to the example in FIG. 2, since an extra k bits of data detection information is further stored in the same memory cell, a raw BER 221 may increase in comparison to the raw BER 211 when storing the N-bit data detection information. However, when storing the N+k bit data detection information, a stronger error correction coding and decoding may be performed than when storing the N-bit data detection information. Accordingly, referring to the example in FIG. 2, a final BER 222 when storing the N+k bit data detection information may be lower than the final BER 212 when storing the N-bit data detection information.

According to example embodiments, when a threshold error rate 223 of the data stored in the memory cell is determined, the determination unit 110 may determine a number of bits of data detection information to be N+k so that the final BER 222 is lower than the threshold error rate 223.

Figure 3:
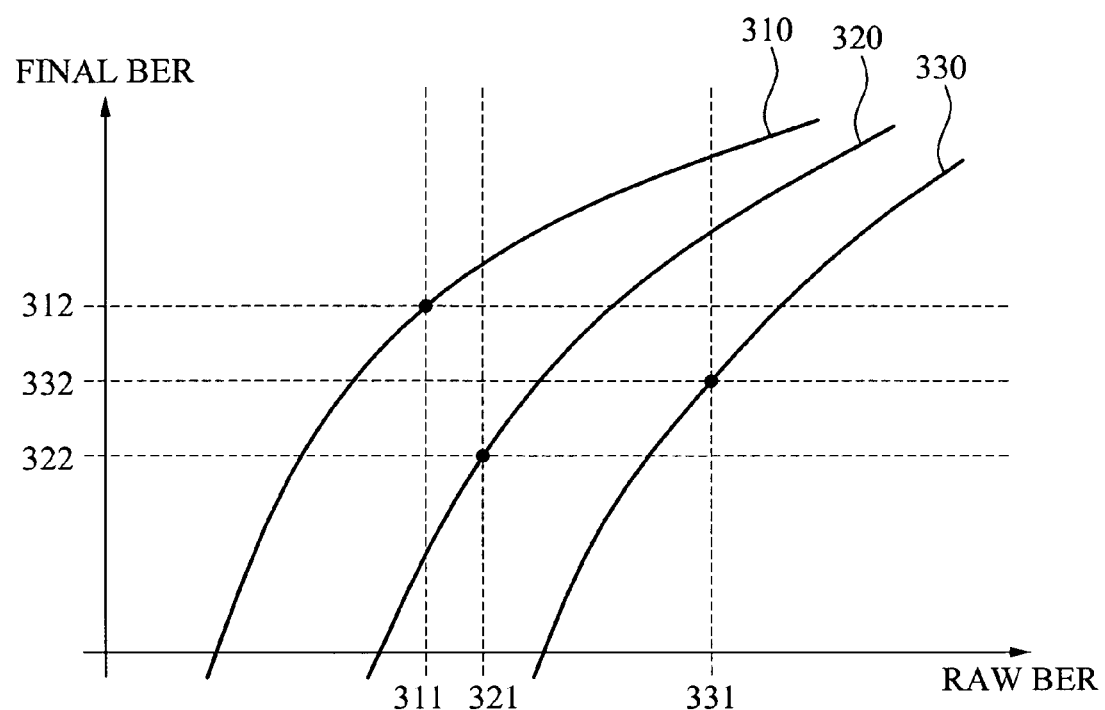
FIG. 3 is a conceptual diagram illustrating a process of determining a number of bits of data to be stored in a memory cell and a number of bits of data detection information in order to minimize a BER of the data to be stored in the memory cell according to example embodiments.

FIG. 3 is a conceptual diagram illustrating determining a number of bits of data and a number of bits of data detection information to be stored in a memory cell in order to enable a BER of the data to be stored in the memory cell to be minimum according to example embodiments. Hereinafter, a method of determining the number of bits of data and the number of bits of the data detection information to be stored in the memory cell is described in detail with reference to FIG. 3.

In FIG. 3, a horizontal axis indicates a raw BER which is a BER before correcting an error of the data stored in the memory cell. A vertical axis indicates a final BER which is a BER after correcting the error by performing an error correction decoding with respect to the data stored in the memory cell.

A curve 310 indicates an error correcting capability of an error correction coding unit when storing N-bit data detection information. A curve 320 indicates an error correcting capability of the error correction coding unit when storing N+k1 bit data detection information. A curve 330 indicates an error correcting capability of the error correction coding unit when storing N+k2 bit data detection information.

A raw BER 311 when storing the N-bit data detection information, a raw BER 321 when storing the N+k1 bit data detection information, and a raw BER 331 when storing the N+k2 bit data detection information are illustrated in FIG. 3. A final BER 312 when storing the N-bit data detection information, a final BER 322 when storing the N+k1 bit data detection information, and a final BER 332 when storing the N+k2 bit data detection information are illustrated in FIG. 3.

The raw BERs 321 and 331 may be greater than the raw BER 311. However, since a stronger error correction coding scheme may be used, the final BERs 322 and 332 may be lower than the final BER 312.

According to example embodiments, a determination unit 110 of a memory data storage apparatus 100 may determine a number of bits of data detection information to enable a final BER of data to be stored in the memory cell to be a minimum.

An amount of information which may be stored in the memory cell may be determined according to a number of possible states of the memory cell. When maximum information is stored in the memory cell, a length of information which may be stored in the memory cell may be determined according to the number of possible states of the memory cell. The information stored in the memory cell may include data and data detection information. Accordingly, when the number of bits of the data detection information increases, the number of bits of the data to be stored in the memory cell may decrease.

According to example embodiments, the determination unit 110 of the memory data storage apparatus 100 may determine the number of bits of the data to be stored in the memory cell to enable a final BER of the data to be stored in the memory cell to be a minimum.

Figure 4:
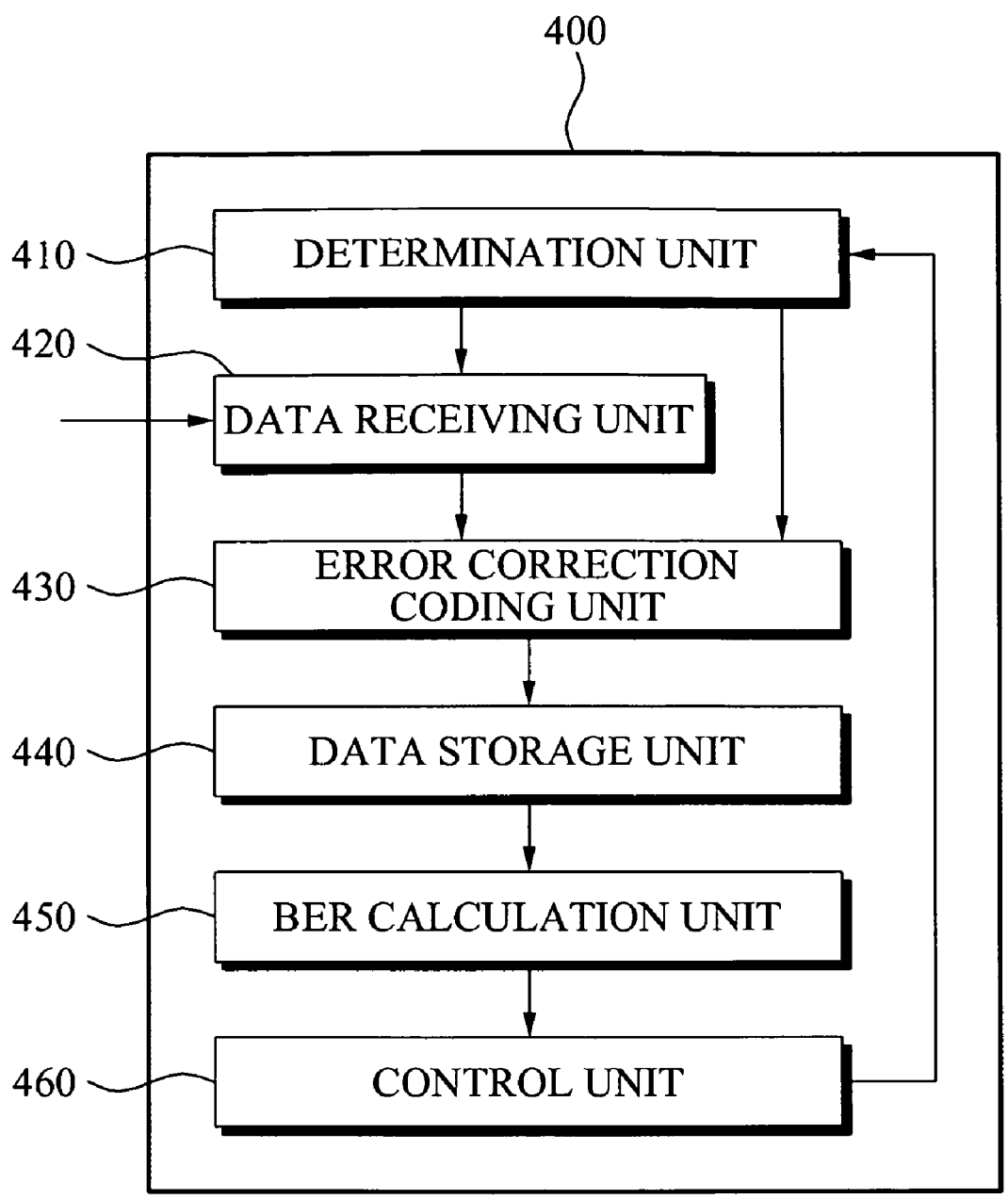
FIG. 4 is a block diagram illustrating a configuration of a memory data detection apparatus which may calculate a BER of data stored in a memory cell and re-store the data based on the calculated BER according to example embodiments.

FIG. 4 is a block diagram illustrating a memory data detection apparatus 400, according to example embodiments, which may calculate a BER of data stored in a memory cell and re-store the data based on the calculated BER. Hereinafter, an operation of the memory data detection apparatus 400 re-storing the data is described in detail with reference to FIG. 4. According to example embodiments, the memory data detection apparatus 400 may include a determination unit 410, data receiving unit 420, error correction coding unit 430, data storage unit 440, BER calculation unit 450, and control unit 460.

The determination unit 410 may determine a number of bits of data and a number of bits of data detection information to be stored in the memory cell. According to example embodiments, the determination unit 410 may determine the number of bits of the data or the number of bits of the data detection information based on a threshold error rate of the data to be stored in the memory cell.

The data receiving unit 420 may receive data corresponding to the number of bits determined by the determination unit 410.

The error correction coding unit 430 may perform an error correction coding with respect to the received data and generate data detection information. The error correction coding unit 430 may generate the data detection information based on the determined number of bits of the data detection information. According to example embodiments, the error correction coding unit 430 may generate the data detection information of the data to be stored in the memory cell according to a Convolutional coding scheme, BCH coding scheme, TCM coding scheme, BCM coding scheme, Reed-Solomon coding scheme, or turbo coding scheme.

The data storage unit 440 may store the data received by the data receiving unit 420 and the data detection information generated by the error correction coding unit 430 in the memory cell.

The BER calculation unit 450 may calculate a BER of the data stored in the memory cell. According to example embodiments, the BER calculation unit 450 may determine whether an error is generated in the data stored in the memory cell using the data detection information.

The control unit 460 may compare a BER of the data stored in the memory cell with a threshold error rate of the data stored in the memory cell. According to example embodiments, when the BER of the data stored in the memory cell is greater than the threshold error rate, the determination unit 410 may redetermine the number of bits of the data or the number of bits of the data detection information.

According to example embodiments, the determination unit 410 may redetermine a number of bits of data detection information to be greater than a number of bits of existing data detection information. Thus, error correction coding unit 430 may use a stronger error correction coding scheme. Accordingly, a BER of error-corrected data using an error correction decoding scheme may be lower than the threshold error rate.

Figure 5:
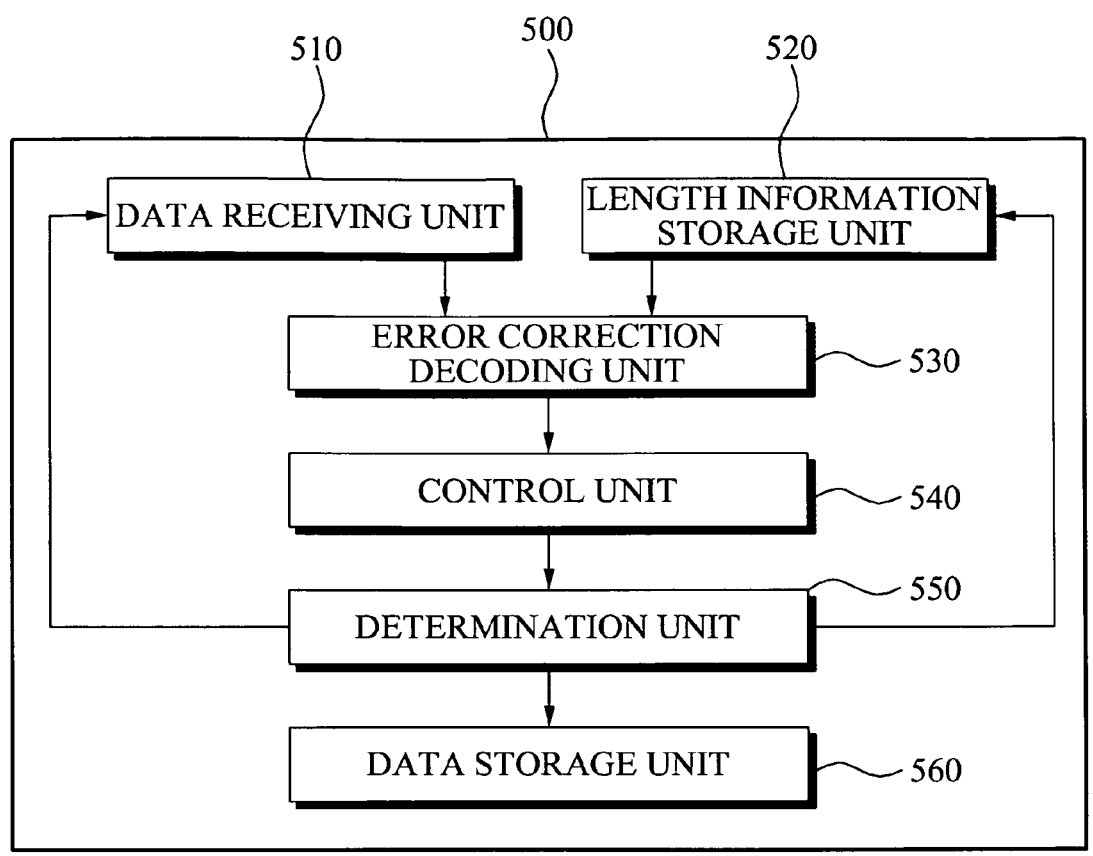
FIG. 5 is a block diagram illustrating a configuration of a memory data detection apparatus which may redetermine a number of bits of data and a number of bits of data detection information based on a BER of data stored in a memory cell according to example embodiments.

FIG. 5 is a block diagram illustrating a configuration of a memory data detection apparatus 500, according to example embodiments, which may redetermine a number of bits of data and a number of bits of data detection information based on a BER of data stored in a memory cell according to example embodiments. An operation of the memory data detection apparatus 500 is described in detail with reference to FIG. 5. The memory data detection apparatus 500 may include a data receiving unit 510, length information storage unit 520, error correction decoding unit 530, control unit 540, determination unit 550, and data storage unit 560.

The data storage unit 560 may store data and data detection information in the memory cell. According to example embodiments, a number of bits of information stored in the memory cell may be determined according to a number of possible states of the memory cell. The information stored in the memory cell may include the data and data detection information.

The length information storage unit 520 may store the number of bits of the data stored in the memory cell and the number of bits of the data detection information.

The data receiving unit 510 may receive data with a length corresponding to the number of bits of the data stored in the memory cell. According to example embodiments, the data receiving unit 510 may receive the data from a data division unit. The data division unit may divide all data to be stored in the memory cell into a plurality of data streams based on the number of bits of the data stored in the memory cell. Also, the data division unit may transmit the divided data streams to the data receiving unit 510. The data received by the data receiving unit 510 may be error correction-coded. The data storage unit 560 may store the error correction-coded data.

The error correction decoding unit 530 may calculate a BER of the data stored in the memory cell based on the data detection information. According to example embodiments, the error correction decoding unit 530 may perform the error correction decoding with respect to the data stored in the memory cell by referring to the number of bits of the data detection information and the number of bits of the data stored in the memory cell.

The control unit 540 may compare the BER calculated by the error correction decoding unit 530 with a predetermined threshold error rate.

The determination unit 550 may redetermine the number of bits of the data or the number of bits of the data detection information based on a result of the comparing. According to example embodiments, when the BER calculated by the error correction decoding unit 530 is greater than the threshold error rate, the determination unit 550 may redetermine a number of bits of data detection information to be greater than a number of bits of the existing data detection information.

According to example embodiments, the determination unit 550 may update the length information storage unit 520 based on the redetermined number of bits of the data or the redetermined number of bits of the data detection information.

According to example embodiments, the determination unit 550 may determine the number of bits of the data to be stored in the memory cell or the number of bits of the data detection information based on the number of possible states of the memory cell. A maximum number of bits of information which may be stored in the memory cell may be determined based on the number of possible states of the memory cell. The information which may be stored in the memory cell may include data detection information and data to be stored in the memory cell. Accordingly, the number of bits of the data to be stored in the memory cell or the number of bits of the data detection information may be determined considering the number of possible states of the memory cell.

According to example embodiments, an error correction coding unit may perform a stronger error correction coding using an increased number of bits of data detection information. The data storage unit 560 may re-store the error correction-coded data in the memory cell or the increased-bit data detection information in the memory cell.

When the number of bits of the data to be stored in the memory cell is fixed and the number of bits of the data detection information increases, a BER of data which is not error correction-decoded may increase. However, a stronger error correction decoding may be performed based on the increased data detection information. Accordingly, a BER of data where an error is corrected through the error correction decoding may decrease. According to example embodiments, the determination unit 550 may determine the number of bits of the data to be stored in the memory cell and the number of bits of the data detection information to minimize a BER of the data to be re-stored.

Figure 6:
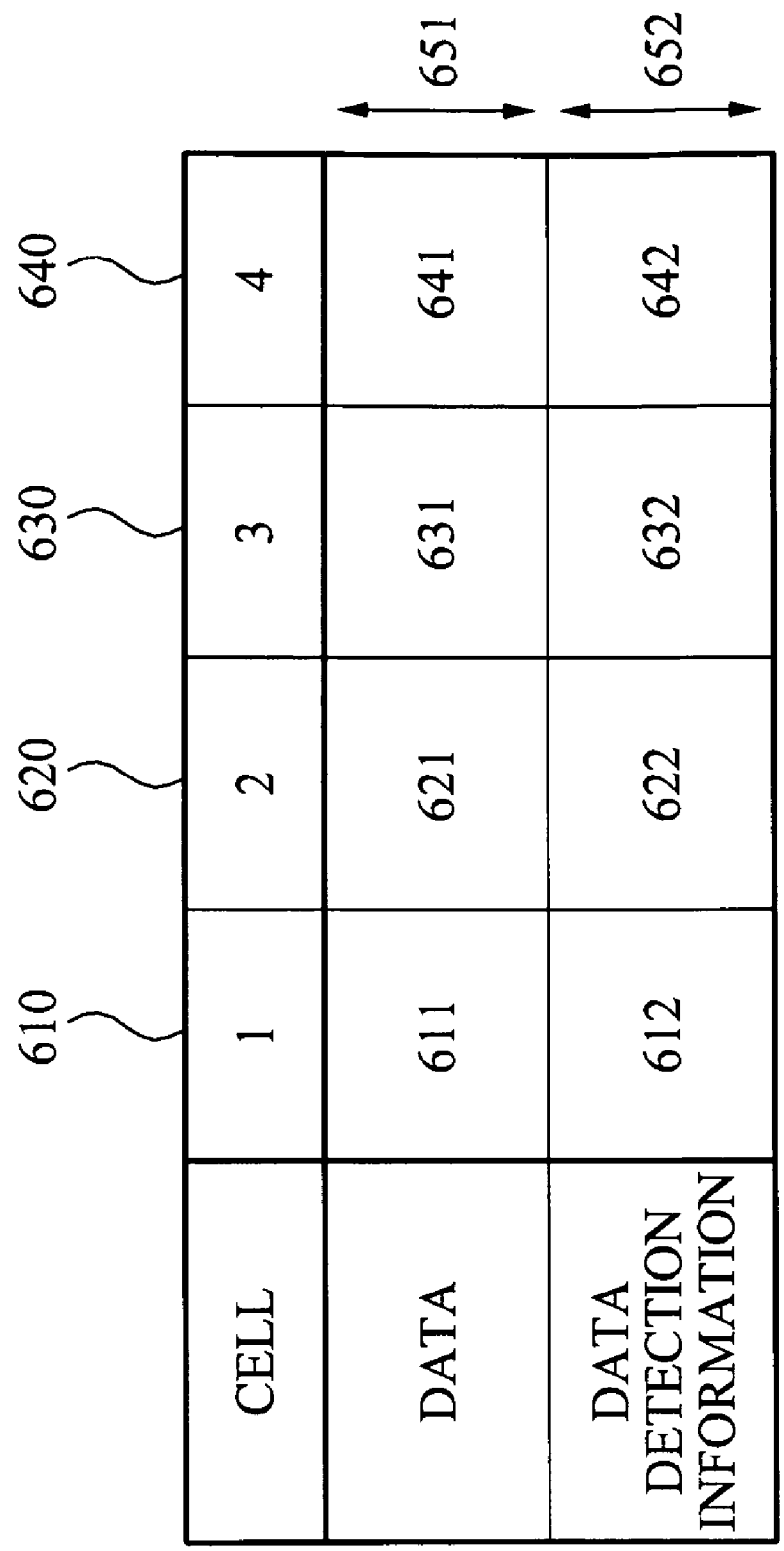
FIG. 6 is a conceptual diagram illustrating a process of storing data and data detection information in a memory cell according to example embodiments.

FIG. 6 is a conceptual diagram illustrating a method of storing data and data detection information in a memory cell according to example embodiments. Hereinafter, storing the data and data detection information in the memory cell is described in detail with reference to FIG. 6. A data storage method according to example embodiments may include storing data 611, 621, 631, and 641 or data detection information 612, 622, 632, and 642 in a plurality of memory cells 610, 620, 630, and 640, respectively.

Each of the memory cells 610, 620, 630, and 640 may store information of a plurality of bits. The information of the plurality of bits may include the data 611, 621, 631, and 641 or the data detection information 612, 622, 632, and 642.

According to example embodiments, a number of bits 651 of the data 611, 621, 631, and 641, or a number of bits 652 of the data detection information 612, 622, 632, and 642 stored in each of the memory cells 610, 620, 630, and 640 may be determined according to each of the memory cells 610, 620, 630, and 640. An operation temperature of each of the memory cells 610, 620, 630, and 640 and a channel state from each of the memory cells 610, 620, 630, and 640 to a data detection apparatus may be independent. Accordingly, a BER of the data 611, 621, 631, and 641 stored in each of the memory cells 610, 620, 630, and 640 may be different from each other. Thus, the number of bits 652 may be determined independently with respect to each of the data detection information 612, 622, 632, and 642 in order to enable the BER of the data 611, 621, 631, and 641 stored in each of the memory cells 610, 620, 630, and 640 to be less than a predetermined threshold error rate.

Though the data 611, 621, 631, and 641 and the data detection information 612, 622, 632, and 642 stored in each of the memory cells 610, 620, 630 are illustrated as being clearly divided in FIG. 6, according to example embodiments, data and data detection information may not be clearly divided in an error correction coding scheme performed by an error correction coding unit.

According to example embodiments, the error correction coding unit may perform the error correction coding using a systematic code such as a Reed-Solomon coding scheme. In this case, the data 611, 621, 631, and 641 and the data detection information 612, 622, 632, and 642 may be clearly divided.

According to example embodiments, the error correction coding unit may perform the error correction coding using a non-systematic code such as a Turbo coding scheme. In this case, the data 611, 621, 631, and 641 and the data detection information 612, 622, 632, and 642 may not be clearly divided. Although the data 611, 621, 631, and 641 and the data detection information 612, 622, 632, and 642 may not be clearly divided, the error correction coding unit may generate error correction information based on the number of bits of the data 611, 621, 631, and 641 and the number of bits of the data detection information 612, 622, 632, and 642 determined by the determination unit.

FIG. 7 is a flowchart illustrating a method of determining a number of bits of data to be stored in a memory cell according to example embodiments. Hereinafter, the method of determining the number of bits of the data to be stored in the memory cell is described in detail with reference to FIG. 7.

In operation S710, storage state maintenance information about the data to be stored in the memory cell may be received. According to example embodiments, the storage state maintenance information may include a threshold error rate of the data to be stored in the memory cell.

In operation S720, an error correction coding scheme with respect to the data to be stored in the memory cell may be determined. According to example embodiments, in operation S720, any one of a Convolutional coding scheme, BCH coding scheme, TCM coding scheme, BCM coding scheme, Reed-Solomon coding scheme, and turbo coding scheme may be determined as the error correction coding scheme with respect to the data to be stored in the memory cell.

According to example embodiments, in operation S720, the error correction coding scheme may be determined considering the threshold error rate received in operation S710.

In operation S730, a number of bits of the data to be stored in the memory cell and a number of bits of data detection information to be stored in the memory cell may be determined. According to example embodiments, in operation S730, the number of bits of the data to be stored in the memory cell and the number of bits of the data detection information may be determined based on the received threshold error rate received in operation S710. According to example embodiments, in operation S730, the number of bits of the data or the number of bits of the data detection information may be determined to enable the BER of the data to be stored in the memory cell to be less than the threshold error rate received in operation S710.

According to example embodiments, in operation S730, the number of bits of the data or the number of bits of the data detection information may be determined to enable the BER of the data to be stored in the memory cell to be a minimum.

According to example embodiments, in operation S730, the number of bits of the data or the number of bits of the data detection information may be determined based on a number of possible states of the memory cell. A number of bits of information which may be stored in the memory cell may be determined based on the number of possible states of the memory cell. The information which may be stored in the memory cell may include data to be stored in the memory cell and data detection information. Accordingly, a sum of the number of bits of the data and the number of bits of the data detection information may be required not to be greater than the number of bits of the information which may be stored in the memory cell.

In operation S740, data corresponding to the number of bits of the data determined in operation S730 may be received.

In operation S750, an error correction coding may be performed with respect to the received data and data detection information may be generated. According to example embodiments, in operation S750, the error correction coding may be performed according to the error correction coding scheme determined in operation S720. According to example embodiments, in operation S750, the data detection information may be generated considering the number of bits of the data determined in operation S730.

According to example embodiments, in operation S760, the data detection information may be stored in the memory cell. According to example embodiments, in operation S760, the storage state maintenance information received in operation S710 may be stored in the memory cell. In this instance, the storage state maintenance information may be included in the data detection information.

In operation S770, a BER with respect to the data stored in the memory cell may be calculated. According to example embodiments, in operation S770, the BER of the data stored in the memory cell may be calculated by referring to the data detection information generated in operation S750.

In operation S780, the BER calculated in operation S770 may be compared with a threshold error rate.

When the BER calculated in operation S770 is greater than or equal to the threshold error rate, the number of bits of the data or the number of bits of the data detection information may be redetermined in operation S790. According to example embodiments, the number of bits of the data or the number of bits of the data detection information may be determined to enable the BER of the data stored in the memory cell to be less than the threshold error rate.

In operation S750, the data detection information may be regenerated considering the number of bits of the data detection information redetermined in operation S790.

The memory data storage method according example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described example embodiments.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory data storage apparatus, comprising:
   a data storage unit that stores data and data detection information;
   a determination unit that determines a number of bits of the data and a number of bits of the data detection information to be stored in a memory cell;
   a length information storage unit that stores a number of bits of each of the data and data detection information;
   an error correction decoding unit that calculates a BER of the stored data based on the data detection information; and
   a control unit that compares the calculated BER and a reference threshold error rate,
   wherein the determination unit redetermines the number of bits of the data or the number of bits of the data detection information based on a result of the comparing, and
   the data storage unit re-stores the data based on the redetermined number of bits of the data or re-stores the data detection information based on the redetermined number of bits of the data detection information.

2. The memory data storage apparatus of claim 1, further comprising:
   a data receiving unit that receives data corresponding to the number of bits of the data determined by the determination unit;
   an error correction coding unit that performs an error correction coding with respect to the received data and generates the data detection information stored by the data storage unit, the generated data detection information corresponding to the number of bits of the data detection information determined by the determination unit.

3. The memory data storage apparatus of claim 2, wherein the data receiving unit receives storage state maintenance information about the data, and the data storage unit stores the storage state maintenance information in the memory cell.

4. The memory data storage apparatus of claim 2, wherein the data receiving unit receives a threshold error rate of the data to be stored, and the determination unit determines the number of bits of the data or the number of bits of the data detection information based on the received threshold error rate.

5. The memory data storage apparatus of claim 2, wherein the determination unit determines the number of bits of the data or the number of bits of the data detection information to minimize a bit error rate (BER) of the data to be stored.

6. The memory data storage apparatus of claim 2, wherein the determination unit determines the number of bits of the data or the number of bits of the data detection information based on a number of possible states of the memory cell.

7. The memory data storage, apparatus of claim 2, wherein the determination unit determines an error correction coding scheme of the received data, and the error correction coding unit generates the data detection information according to the determined error correction coding scheme.

8. The memory data storage apparatus of claim 2, further comprising:
   a BER calculation unit that calculates a BER of the stored data; and
   a control unit that compares the calculated BER and a reference threshold error rate,
   wherein the determination unit redetermines the number of bits of the data or the number of bits of the data detection information based on a result of the comparison by the control unit, and the data storage unit re-stores the data based on the redetermined number of bits of the data and re-stores the data detection information based on the redetermined number of bits of the data detection information.

9. The memory data detection apparatus of claim 1, wherein the determination unit determines the number of bits of the data or the number of bits of the data detection information to minimize a BER of the data to be re-stored.

10. The memory data detection apparatus of claim 1, wherein the determination unit determines the number of bits of the data or the number of bits of the data detection information based on a number of possible states of the memory cell.

11. A memory data storage method, comprising:
    determining a number of bits of data and a number of bits of data detection information to be stored in a memory cell;
    receiving data corresponding to the determined number of bits;
    performing an error correction coding with respect to the received data and generating data detection information;
    storing the received data and generated data detection information in the memory cell;
    storing a number of bits of each of the data and data detection information in a length information storage unit;
    calculating a BER of the stored data based on the data detection information using an error correction decoding unit; and
    comparing the calculated BER and a reference threshold error rate using a control unit,
    wherein the determining includes redetermining the number of bits of the data or the number of bits of the data detection information based on a result of the comparing, and
    the data is re-stored based on the redetermined number of bits of the data or re-stores the data detection information based on the redetermined number of bits of the data detection information.

12. The memory data storage method of claim 11, wherein the data detection information includes a threshold error rate of the data to be stored in the memory cell, and the storing step includes stores the data detection information including the threshold error rate of the data in the memory cell.

13. The memory data storage method of claim 11, further comprising:
    receiving a threshold error rate of the data to be stored,
    wherein the determining step includes determining the number of bits of the data or the number of bits of the data detection information based on the received threshold error rate.

14. The memory data storage method of claim 11, wherein the determining step include determining the number of bits of the data or the number of bits of the data detection information to enable a BER of the data to be stored in the memory cell to be minimum.

15. The memory data storage method of claim 11, wherein the determining step includes determining the number of bits of the data or the number of bits of the data detection information based on a number of possible states of the memory cell.

16. The memory data storage method of claim 11, further comprising:
    determining an error correction coding scheme to be used for the received data,
    wherein the generating step includes generating the data detection information according to the determined error correction coding scheme.

17. A computer-readable recording medium storing a program for implementing a memory data storage method, the method comprising:
    determining a number of bits of data and a number of bits of data detection information to be stored in a memory cell;
    receiving data corresponding to the determined number of bits;
    performing an error correction coding with respect to the received data and generating data detection information;
    storing the received data and generated data detection information in the memory cell;
    storing a number of bits of each of the data and data detection information in a length information storage unit;
    calculating a BER of the stored data based on the data detection information using an error correction decoding unit; and
    comparing the calculated BER and a reference threshold error rate using a control unit,
    wherein the determining includes redetermining the number of bits of the data or the number of bits of the data detection information based on a result of the comparing, and
    the data is re-stored based on the redetermined number of bits of the data or re-stores the data detection information based on the redetermined number of bits of the data detection information.

* * * * *